US008089811B2

(12) United States Patent
Kang et al.

(10) Patent No.: US 8,089,811 B2
(45) Date of Patent: Jan. 3, 2012

(54) FLASH MEMORY DEVICES WITH MEMORY CELLS STRINGS INCLUDING DUMMY TRANSISTORS WITH SELECTIVE THRESHOLD VOLTAGES

(75) Inventors: Myoung Gon Kang, Gyeonggi-do (KR); Kitae Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 12/580,949

(22) Filed: Oct. 16, 2009

(65) Prior Publication Data

US 2010/0097862 A1  Apr. 22, 2010

(30) Foreign Application Priority Data

Oct. 20, 2008  (KR) .................. 10-2008-0102536

(51) Int. Cl.
*G11C 11/34* (2006.01)
(52) U.S. Cl. ............. 365/185.17; 365/185.2; 365/210.1
(58) Field of Classification Search ............. 365/185.17, 365/185.2, 210.1
See application file for complete search history.

(56) References Cited

U.S. PATENT DOCUMENTS

| 7,239,556 B2 * | 7/2007 | Abe et al. .................. 365/185.33 |
| 7,301,815 B2 * | 11/2007 | Kurata et al. ............. 365/185.2 |
| 7,535,764 B2 * | 5/2009 | Chin et al. ................. 365/185.2 |
| 7,652,926 B2 * | 1/2010 | Kang et al. ................ 365/185.2 |
| 7,924,622 B2 * | 4/2011 | Lee et al. .................. 365/185.2 |
| 2010/0046290 A1 * | 2/2010 | Park et al. ................. 365/185.2 |

FOREIGN PATENT DOCUMENTS

| JP | 10-199280 | 7/1998 |
| KR | 1020060060528 A | 6/2006 |
| KR | 1020070018216 A | 2/2007 |

\* cited by examiner

*Primary Examiner* — Alexander Sofocleous
(74) *Attorney, Agent, or Firm* — Myers Bigel Sibley & Sajovec, P.A.

(57) ABSTRACT

Flash memory devices include a first memory cell string including a plurality of serially-connected memory cells and first and second serially-connected dummy transistors configured to couple the serially-connected memory cells to a bit line and a second memory cell string including a plurality of serially-connected memory cells and first and second serially-connected dummy transistors configured to couple the serially-connected memory cells to the bit line. The first dummy memory cells of the first and second memory cell strings have gates connected in common to a first dummy word line and have different threshold voltages and the second dummy memory cells of the first and second memory cell strings have gates connected in common to a second dummy bit line and have different threshold voltages. In some embodiments, the first dummy memory cell of the first memory cell string and the second dummy memory cell of the second memory cell string may have threshold voltages greater than a predetermined voltage and the second dummy memory cell of the first memory cell string and the first dummy memory cell of the second memory cell string may have threshold voltages less than the predetermined voltage.

15 Claims, 15 Drawing Sheets

FLASH MEMORY DEVICES WITH MEMORY CELLS STRINGS INCLUDING DUMMY TRANSISTORS WITH SELECTIVE THRESHOLD VOLTAGES

CROSS-REFERENCE TO RELATED APPLICATION

This U.S. non-provisional patent application claims priority under 35 U.S.C §119 to Korean Patent Application No. 10-2008-0102536, filed on Oct. 20, 2008, the entirety of which is herein incorporated by reference.

BACKGROUND

The present invention relates to semiconductor memory devices and, more specifically, to flash memory devices.

There is an increasing demand for electrically erasable and programmable semiconductor memory devices which are capable of retaining their stored data even without power supplies. In addition, there is a demand for high-capacity semiconductor memory devices. Flash memory devices can provide high capacity even without power supplies and retain their stored data even when their power supplies are interrupted. For this reason, flash memory devices have been widely used in electronic devices (e.g., portable electronic devices) whose power supplies may be suddenly interrupted.

Semiconductor memory devices have increased in capacity. Capacity is proportional to integration density of a semiconductor memory device. According to so-called "Hwang's Law", semiconductor memory devices have doubled in density every year. i.e., increasingly higher-capacity semiconductor memory devices can be fabricated. However, the need for increased data capacity is increasing with the increase in active data exchange resulting from advances in communication networks. It is therefore desirable to provide even higher density semiconductor memory devices to meet these capacity needs.

SUMMARY

Some embodiments of the present invention provide flash memory devices including a first memory cell string including a plurality of serially-connected memory cells and first and second serially-connected dummy transistors configured to couple the serially-connected memory cells to a bit line and a second memory cell string including a plurality of serially-connected memory cells and first and second serially-connected dummy transistors configured to couple the serially-connected memory cells to the bit line. The first dummy memory cells of the first and second memory cell strings have gates connected in common to a first dummy word line and have different threshold voltages and the second dummy memory cells of the first and second memory cell strings have gates connected in common to a second dummy bit line and have different threshold voltages. In some embodiments, the first dummy memory cell of the first memory cell string and the second dummy memory cell of the second memory cell string may have threshold voltages greater than a predetermined voltage and the second dummy memory cell of the first memory cell string and the first dummy memory cell of the second memory cell string may have threshold voltages less than the predetermined voltage. For example, the first dummy memory cell of the first memory cell string and the second dummy memory cell of the second memory cell string may have positive threshold voltages and the second dummy memory cell of the first memory cell string and the first dummy memory cell of the second memory cell string may have negative threshold voltages.

In further embodiments, the flash memory devices include a control circuit configured to control the threshold voltages of the dummy memory cells. The control circuit may be configured to erase the first and second dummy memory cells of the first and second memory cell strings and to thereafter selectively program the first and second dummy memory cells of the first and second memory cell strings.

In some embodiments, the first memory cell string further includes a first ground select transistor configured to connect the serially-connected memory cells of the first memory cell string to a first common source line and the second memory cell string further includes a second ground select transistor configured to connect the serially-connected memory cells of the second memory cell string to a second common source line. The flash memory devices may further include a control circuit configured to apply a program voltage, a pass voltage and a ground voltage to the first dummy word line, the second dummy word line, and the first common source line with, respectively, to program the first dummy transistor of the first memory cell string. The flash memory devices may further include a control circuit configured to apply a pass voltage, a program voltage and a ground voltage to the first dummy word line, the second dummy word line and the second common source line, respectively, to program the second dummy transistor of the second memory cell string.

The serially-connected memory cells of the first memory cell string may be floating gate transistors and the flash memory devices may include a control circuit configured to apply a voltage higher than the threshold voltage of the first dummy transistor of the first memory cell string, a ground voltage and a ground voltage to the first dummy word line, the second dummy word line and the second common source line, respectively, to program a selected one of the floating gate transistors of the first memory cell string. The control circuit may be further configured to increase a channel voltage of the second memory cell string before programming the selected one of the floating gate transistors of the first memory cell string.

The serially-connected memory cells of the second memory cell string may be floating gate transistors and the flash memory devices may further include a control circuit configured to apply a ground voltage, a voltage higher than the threshold voltage of the second dummy transistor of the second memory cell string and a ground voltage supply to the first dummy word line, the second dummy word line and the first common source line, respectively, to program a selected one of the floating gate transistors of the second memory cell string. The control circuit may be further configured to increase a channel voltage of the first memory cell string before programming the selected one of the floating gate transistors of the second memory cell string.

In further embodiments, the first memory cell string further includes third and fourth serially-connected dummy memory cells configured to connect the serially-connected memory cells of the first memory cell string to the first ground select transistor and the second memory cell string further includes third and fourth serially-connected dummy memory cells configured to connect the serially-connected memory cells of the second memory cell string to the second ground select transistor. The third dummy memory cells of the first and second memory cell strings may be connected to a third dummy word line and have different threshold voltages and the fourth dummy memory cells of the first and second memory cell strings may be connected to a fourth dummy word line and have different threshold voltages. The third dummy memory cell of the first memory cell string and the fourth dummy memory cell of the second memory cell string may have threshold voltages greater than a predetermined voltage and the fourth dummy memory cell of the first memory cell string and the third dummy memory cell of the second memory cell string may have threshold voltages less than the predetermined voltage.

DETAILED DESCRIPTION OF EMBODIMENTS

Figure 1:
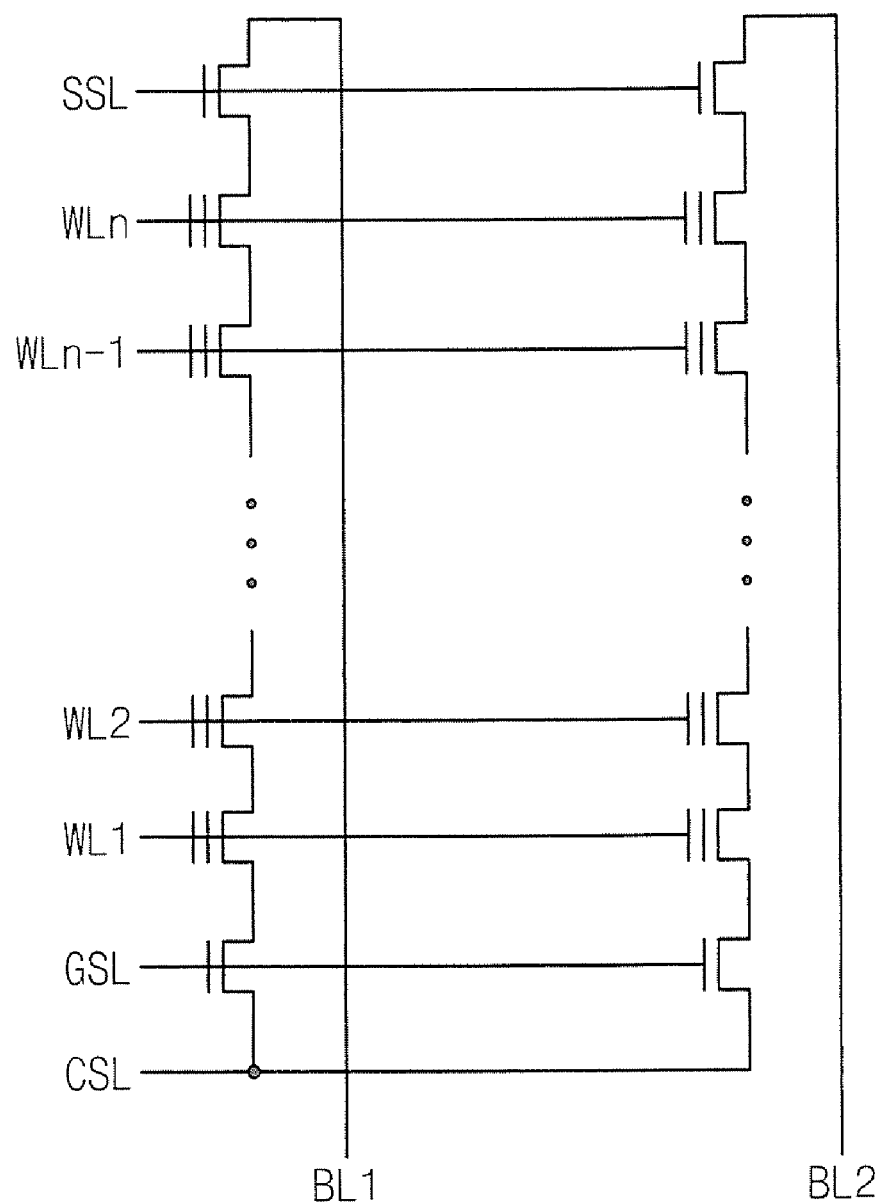
FIG. 1 is a circuit diagram of a conventional NAND-type flash memory.

Some embodiments of the present invention will now be described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like items throughout.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. As used herein, the term "and/or" includes any and all combinations of one or more of the associated listed items and may be abbreviated as "/".

It will be understood that, although the terms first, second, etc. may be used herein to describe various items, these items should not be limited by these terms. These terms are only used to distinguish one item from another. For example, a "first" item could be termed a "second" item, and, similarly, a "second" item could be termed a "first" item without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates othefrwise. It will be further understood that the terms "comprises" and/or "comprising," or "includes" and/or "including" when used in this specification, specify the presence of stated items or operations but do not preclude the presence or addition of one or more other items or operations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

NAND flash memory devices are used as examples herein for illustrating characteristics and functions of some embodiments of the present invention. However, those skilled in the art can easily understand other features and advantages of embodiments of the present invention and that embodiments described herein may be amended or modified and, in general, the present invention is applicable to other types and/or arrangements of devices.

FIG. 1 is a circuit diagram of a typical NAND-type flash memory. The NAND-type flash memory device includes a plurality of memory cell strings. Although two memory cell strings are shown in FIG. 1, the NAND-type flash memory device may include more than two memory cell strings. Each of the memory cell strings may include a string select transistor SST connected to a string select line SSL and a ground select transistor GST connected to a ground select line GSL. A serially-connected plurality of floating gate transistors is serially coupled between the string select transistor and the ground select transistor. The floating gate transistors share source/drain terminals of an adjacent floating gate transistor. Word lines WL1, WL2, . . . , WLn−1, WLn cross the memory cell strings. Control gates of the floating gate transistors in respective rows are connected to respective ones of the word lines WL1, WL2, . . . , WLn−1, WLn. Respective ones of the memory cell strings are connected to respective bit lines BL1, BL2.

Figure 2:
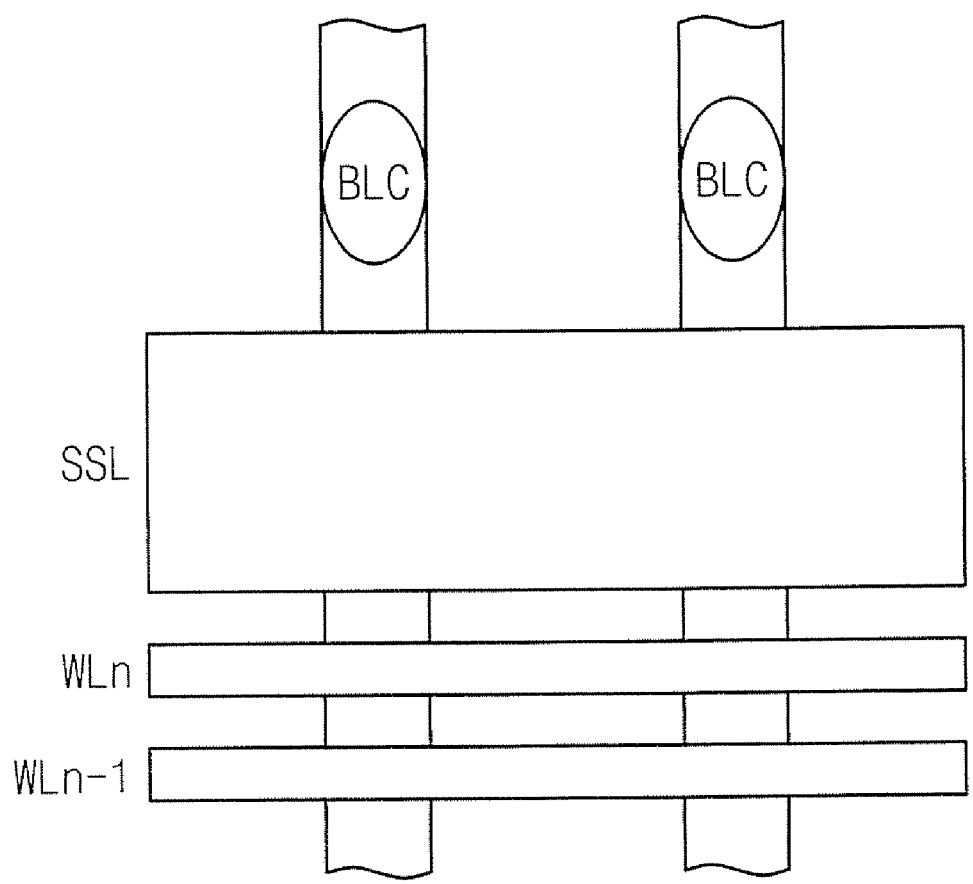
FIG. 2 is a detailed diagram of the flash memory shown in FIG. 1.

FIG. 2 is a detailed diagram of the flash memory shown in FIG. 1. Referring to FIG. 2, a string select line SSL is disposed adjacent a bit line contact BLC, and word lines WLn−1, WLn are arranged adjacent the string select line SSL. Since memory cell strings do not share a bit line in the illustrated configuration, integration density may be limited because each memory cell string has an associated bit line. In order to overcome such limits to integration density, a common bit line structure has been developed.

Figure 3:
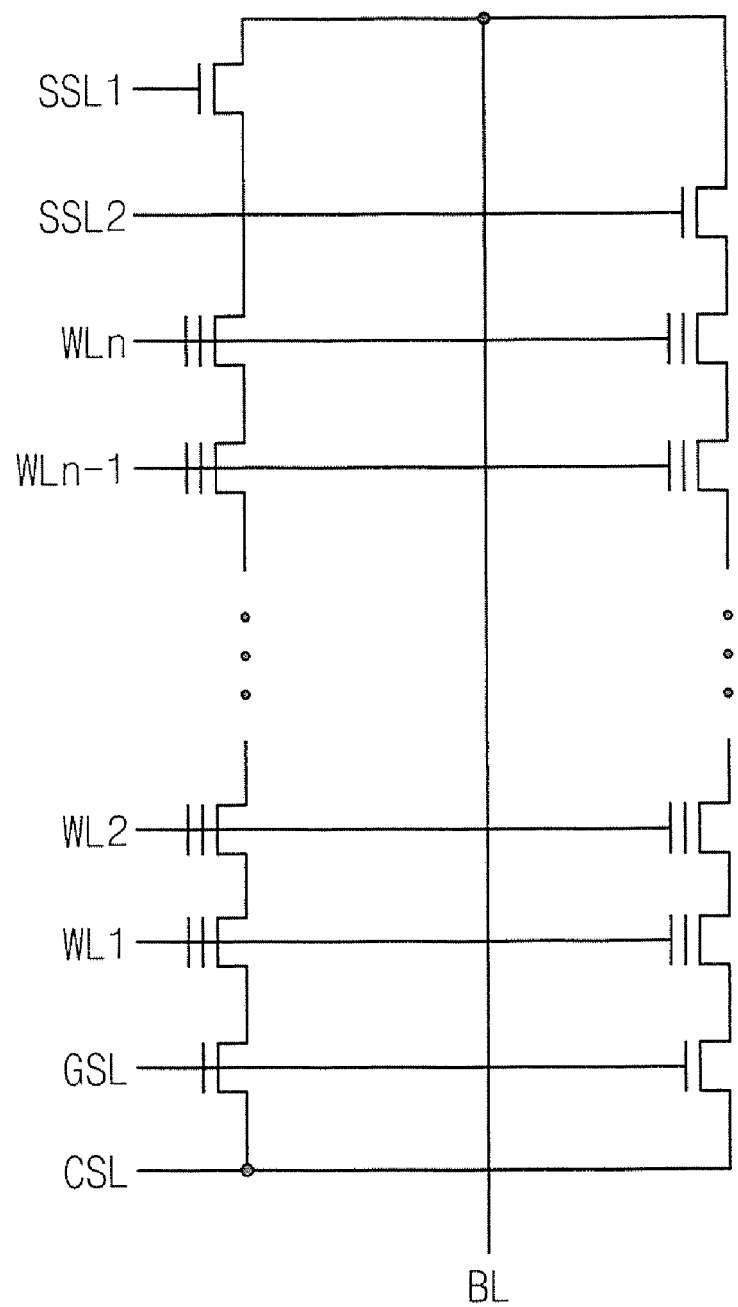
FIG. 3 is a circuit diagram of a flash memory having a common bit line structure.

FIG. 3 is a circuit diagram of a flash memory having a common bit line structure. The flash memory includes a plurality of memory cell strings. Although two memory cell strings are shown in this figure, the flash memory may include at least two memory cell strings. Each of the memory cell strings may include a string select transistor SST connected to a string select line SSL and a ground select transistor GST connected to a ground select line GSL. A plurality of floating gate transistors are serially coupled between the string select transistor SST and the ground select transistor GST. The floating gate transistors share source/drain terminals of an adjacent floating gate transistor. A plurality of word lines WL1, WL2, . . . , Wn–1, WLn cross the memory cell strings. Control gates of floating gate transistors of respective rows are connected to respective ones of the word lines WL1, WL2, . . . , WLn–1, WLn.

The memory cell strings are connected to one bit line BL through a string select transistor. For example, a first memory cell string is connected to the bit line BL through a string select transistor connected to a first memory cell string select line SSL1, and a second memory cell string is connected to the bit line BL through a string select transistor connected to a second memory cell string select line SSL2.

Figure 4:
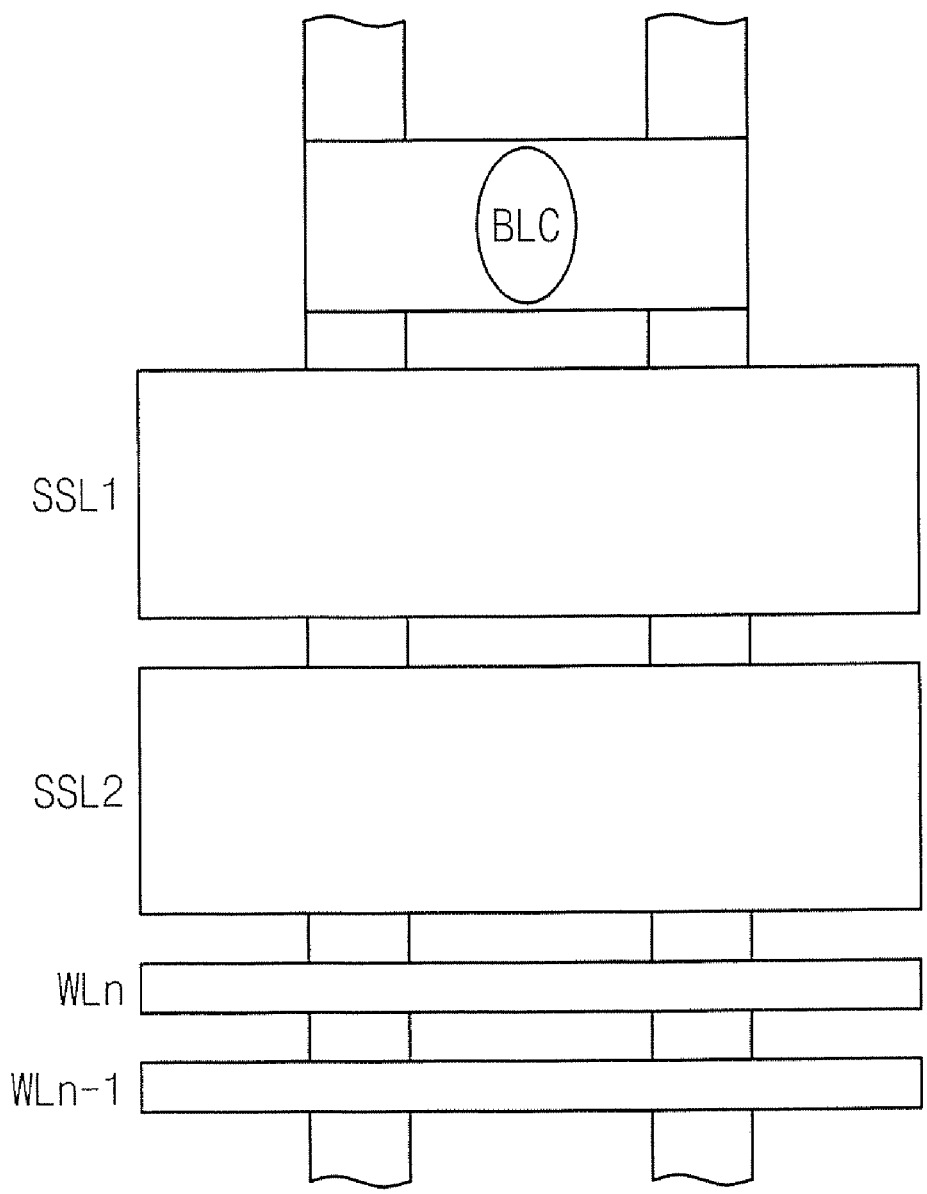
FIG. 4 is a detailed diagram of the flash memory shown in FIG. 3.

FIG. 4 is a detailed diagram of the flash memory shown in FIG. 3. Referring to FIG. 4, string select line SSL 1 and SSL 2 are disposed adjacent a bit line contact BLC, and word lines WLn–1, WLn are disposed adjacent a second memory cell string select line SSL2. As illustrated, each of the string select lines SSL1 and SSL2 has a smaller width than the word lines WLn–1, WLn. Therefore, an integration density of the flash memory decreases.

Figure 5:
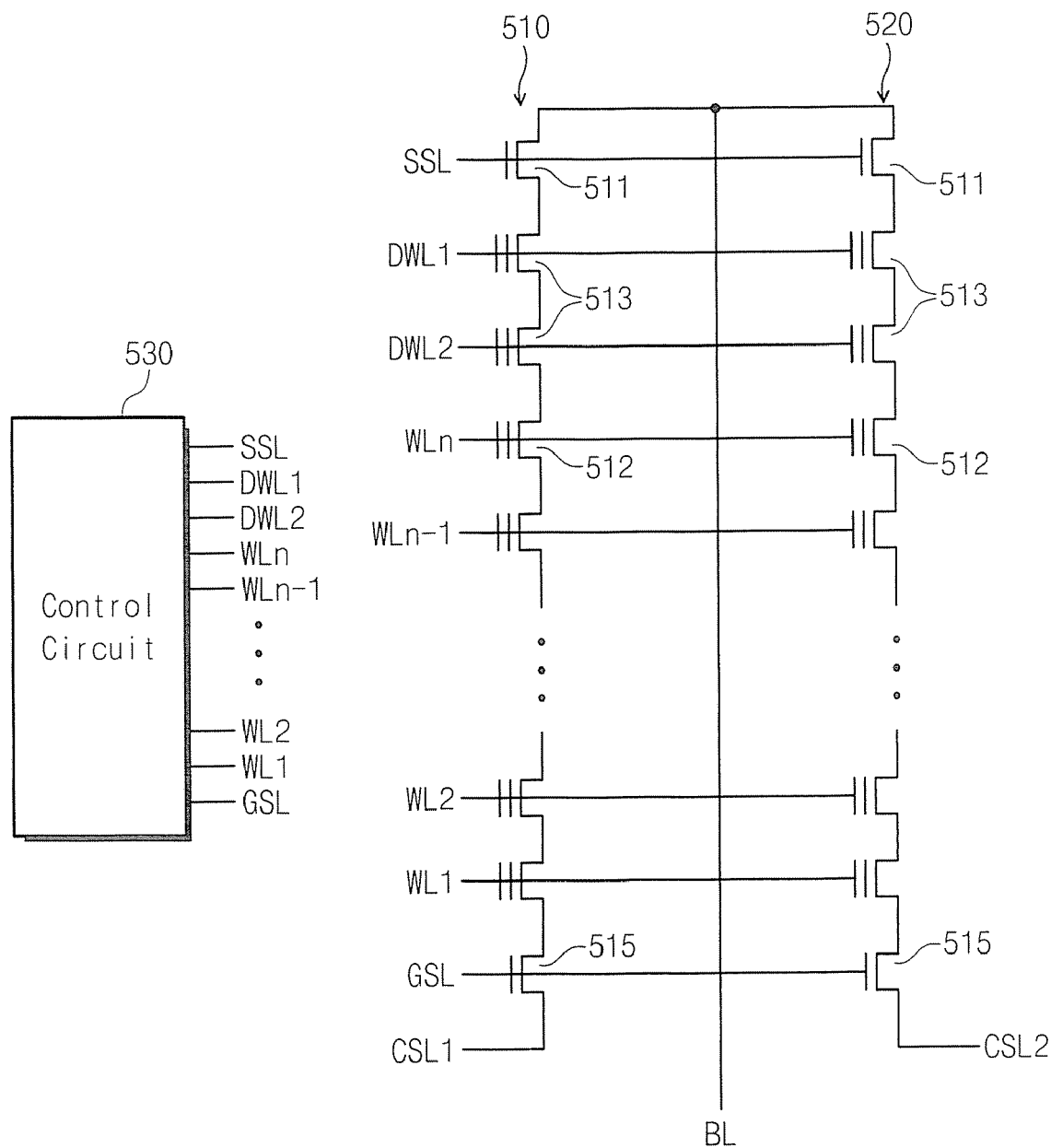
FIG. 5 is a circuit diagram of a flash memory having a common bit line structure according to some embodiments of the present invention.

FIG. 5 is a circuit diagram of a flash memory device 500 having a common bit line structure according to some embodiments of the present invention. Referring to FIG. 5, two memory cell strings 510, 520 share one bit line BL. Each of the memory cell strings 510, 520 includes one string select transistor 511 having a gate connected to a string select line SSL, two dummy transistors 513 having gates connected to respective dummy word lines DWL1, DWL2, n floating gate transistor memory cells 512 having control gates connected to n word lines WL1, WL2, . . . , WLn–1, WLn, and a ground select transistor 515 having a gate connected to a ground select line GSL. The n floating gate transistors 512 may be configured to store data in form of charges. Each floating gate transistor 512 may be configured to store 1-bit data or multi-bit data. The flash memory device 500 further includes a control circuit 530 configured to apply selected voltages to the string select line SSL, the dummy word lines DWL1, DWL2, the word lines WL1, WL2, . . . , WLn–1, WLn and the ground select line GSL.

In some embodiments the present invention, a memory cell string is selected by dummy transistors, which may have threshold voltages that are different from each other. For example, in the embodiments shown in FIG. 5, dummy transistors 513 of the first string 510 connected to the first and second dummy word lines DWL1, DWL2 may have positive and negative threshold voltages, respectively, while dummy transistors 513 of the second string 520 connected to the first and second word lines DWL1, DWL2 may have negative and positive threshold voltages, respectively. Accordingly, the first memory cell string 510 may be connected to the bit line BL by applying a positive voltage to the first dummy word line DWL1 and applying a ground voltage to the second dummy word line DWL2. The second memory cell string may be connected to the bit line BL by applying a ground voltage to the first dummy word line DWL1 and applying a positive voltage to the second dummy word line DWL2. However, the scope of the present invention is not limited thereto. For example, the threshold voltages of the dummy transistors 513 may be reversed.

In some embodiments, dummy transistors are selectively programmed to have different threshold voltages. In some flash memory, a threshold voltage of an erased transistor has a negative value. Thus, a threshold voltage of the dummy transistors may be adjusted by selectively programming the dummy transistors after erasing the flash memory. In some embodiments of the present invention shown in FIG. 5, separate common source lines CSL1, CSL2 are provided to enable selective programming of the dummy transistors. Operations for programming such dummy transistors will be described in detail later.

Figure 6:
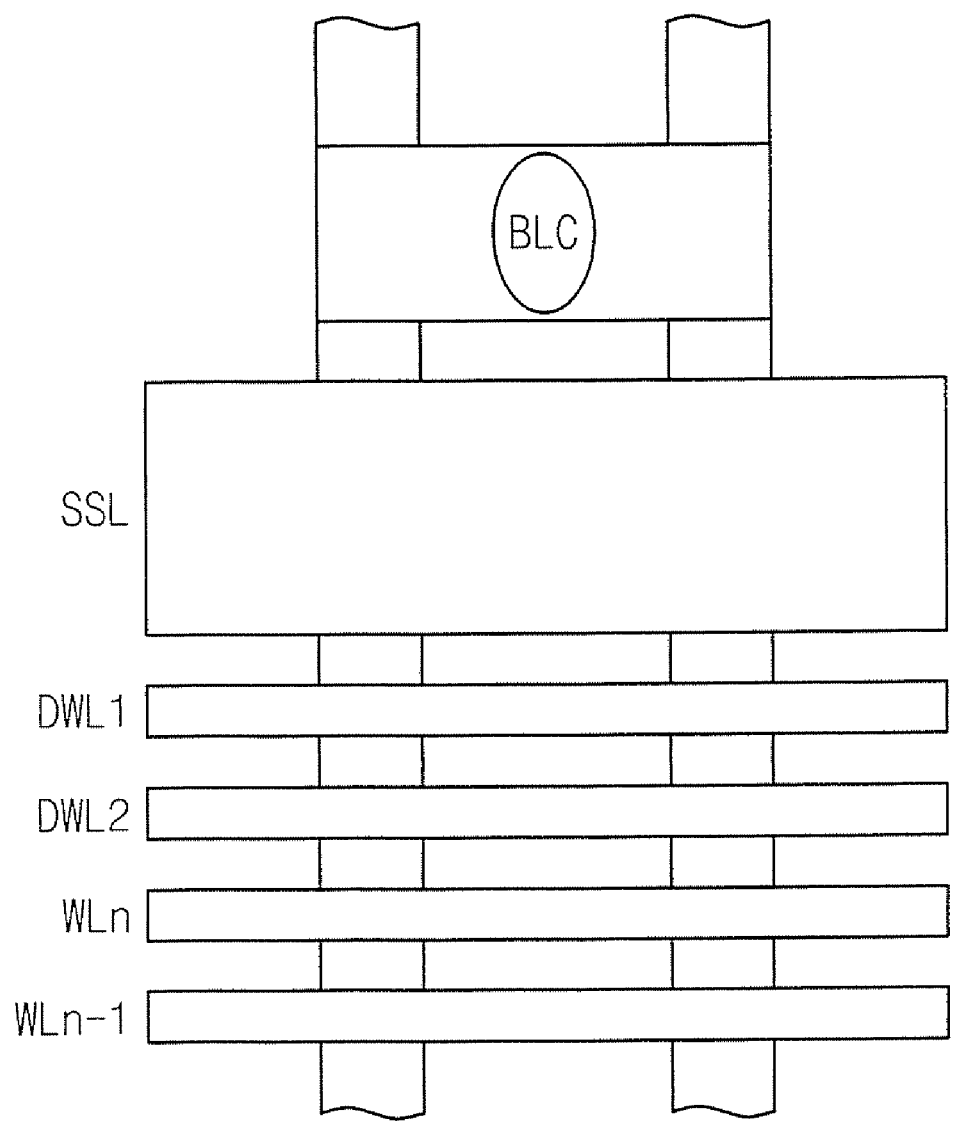
FIG. 6 is a detailed diagram of the flash memory shown in FIG. 5.

FIG. 6 is a detailed diagram of the flash memory shown in FIG. 5. Referring to FIG. 6, two memory cell strings share one bit line contact BLC, which is connected to a bit line (not shown). A string select line SSL is disposed adjacent the bit line contact BLC, and first and second dummy word lines DWL1, DWL2 are disposed adjacent the string select line SSL. Word lines WLn–1, WLn are disposed adjacent the second dummy word line DWL2.

In this embodiment, one string select line SSL and the dummy word lines DWL1, DWL2 are used instead of a plurality of string select lines. One of the memory cell strings may be selected using dummy transistors each corresponding to each of the dummy transistors DWL1, DWL2. The sum of widths of the dummy word lines DWL1, DWL2 is less than the width of the one string select line SSL, integration density may be increased. Moreover, since dummy transistors may be formed by the same process as the floating gate transistors, the fabrication cost of the semiconductor memory device may be reduced. In the illustrated embodiments, a string select transistor SST connected to a string select line SSL may suppress leakage current to the bit line. Therefore, reliability of a flash memory may be enhanced.

Figure 7:
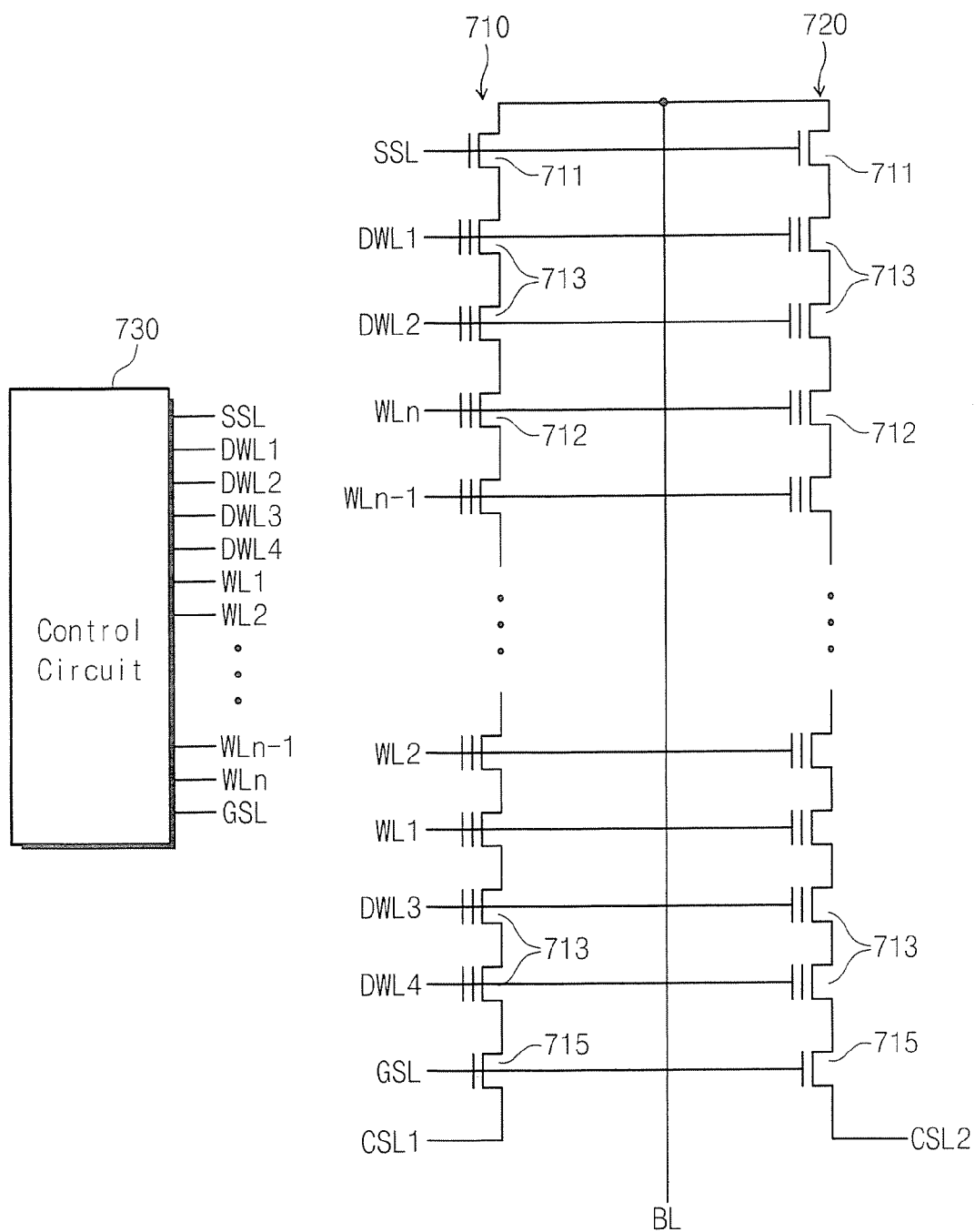
FIG. 7 is a circuit diagram of a flash memory having a common bit line structure according to further embodiments of the present invention.

FIG. 7 is a circuit diagram of a flash memory device 700 having a common bit line structure according to further embodiments of the present invention. Referring to FIG. 7, two memory cell strings 710, 720 are connected to one bit line BL. Each of the memory cell strings 710, 720 includes one string select transistor 711 connected to a string select line SSL, two dummy transistors 713 connected to respective dummy word lines DWL1, DWL2, n floating gate transistor memory cells 712 connected to word lines WL1, WL2, . . . , WLn–1, WLn, and a ground select transistor 715 connected to a ground select line GSL. Sources of the ground select transistors 715 of the respective strings 710, 720 are connected to respective common source lines CSL1, CSL2. The strings 710, 720 also include additional dummy transistors 713 connected to third and fourth dummy word lines DWL3, DWL4 disposed adjacent ground select transistors 715 connected to a ground select line GSL. The dummy transistors 713 connected to the dummy word lines DWL3, DWL4 may suppress leakage current to the common source lines CSL1, CSL2. Therefore, reliability of the flash memory device 700 may be enhanced. Moreover, since the dummy transistors 713 may be formed by the same process as the floating gate transistors 712, fabrication cost may be reduced. A control circuit 730 is configured to apply selected voltages the string select line SSL, the dummy word lines DWL1, DWL2, DWL3, DWL4, the word lines WL1, WL2, . . . , WLn–1, WLn and the ground select line GSL.

Figure 8:
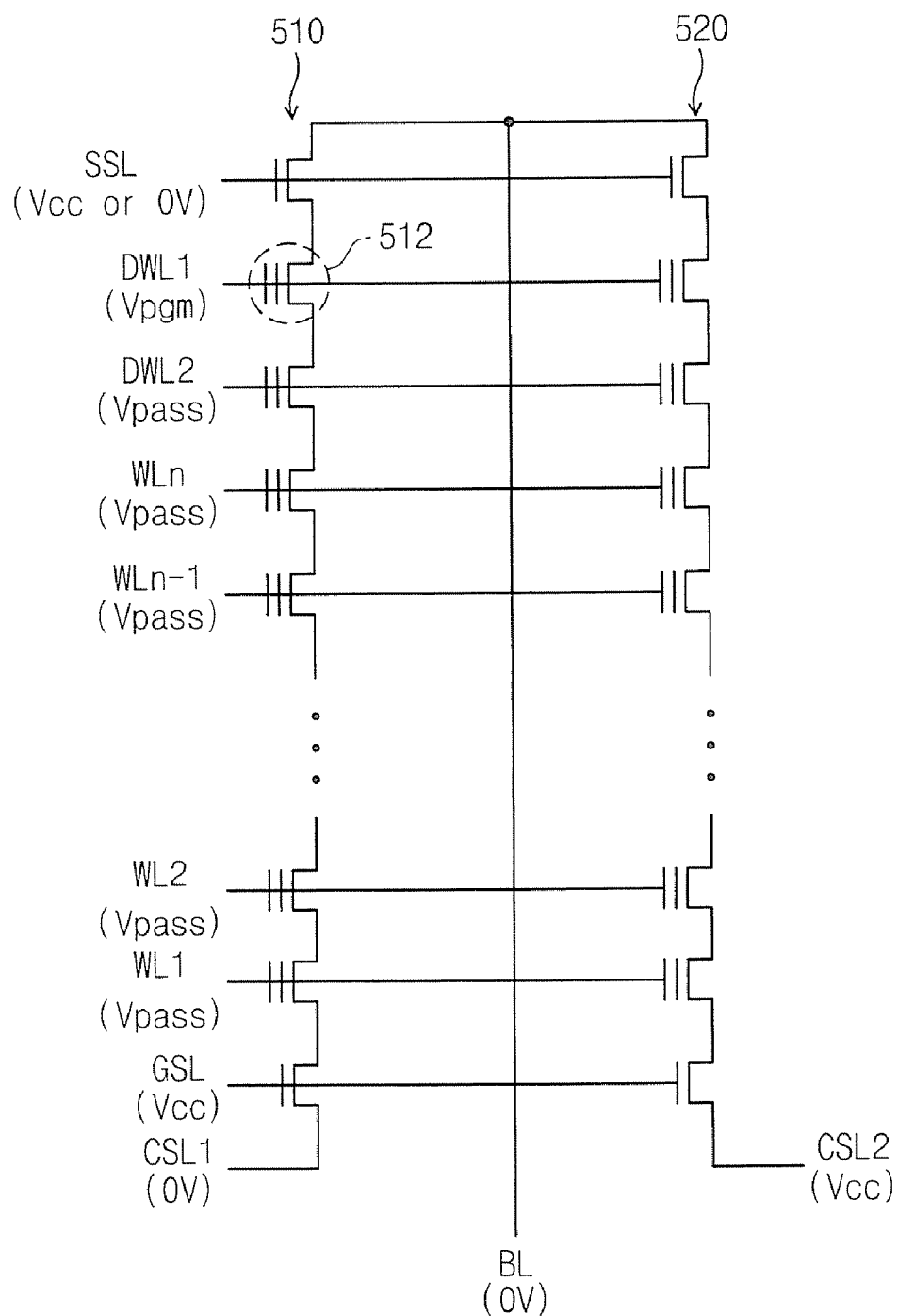
FIG. 8 is a circuit diagram illustrating bias conditions for programming a first dummy transistor of a flash memory according to some embodiments of the present invention.

FIG. 8 is a circuit diagram illustrating bias conditions for programming a first dummy transistor 512 of a string 510 in a flash memory having the structure illustrated in FIG. 5 according to some embodiments of the present invention. As discussed above, dummy transistors may be selectively programmed to have different threshold voltages. In a flash memory, a threshold voltage of an erased transistor may have a negative value. Accordingly, a threshold voltage of the dummy transistors may be altered by selectively programming the dummy transistors after erasing the flash memory.

Programming the first dummy transistor 512 connected to a first dummy word line DWL1 of a first memory cell string 510 will now be described with reference to FIG. 8. A string select line SSL may be supplied with a power supply voltage Vcc or a voltage of 0 volts. When the string select line SSL is supplied with the power supply voltage Vcc, leakage current to a bit line BL may be suppressed. The first dummy word line DWL1 is supplied with a program voltage Vpgm. A second dummy word line DWL2 and word lines WL1, WL2, . . . , WLn−1, WLn are supplied with a pass voltage Vpass. A ground select line GSL is supplied with a power supply voltage Vcc. A common source line CSL1 and a bit line BL are supplied with a voltage of 0 volts. The first dummy transistor 512 is programmed under these conditions, allowing a threshold voltage of the dummy transistor 512 to have a positive value.

A second common source line CSL2 connected to a second string 520 is supplied with a power supply voltage, so transistors of the second memory cell string 520 are not programmed by self-boosting. In a program inhibition method using a self-boosting scheme, a gate select line GSL connected to a gate of a ground select transistor is supplied with a voltage of 0 volts to block a ground path. A selected bit line BL is supplied with a voltage of 0 volts, and an unselected bit line (not shown) is supplied with a power supply voltage Vcc as a program inhibition voltage. After a source of the string select transistor is charged to Vcc-Vth (Vth being a threshold voltage of the string select transistor) by applying a power supply voltage Vcc to the gate of the string select transistor, the string select transistor is substantially blocked (or shut off). A selected word line is supplied with a program voltage Vpgm and unselected word lines are supplied with a pass voltage Vpass, boosting a channel voltage of a program-inhibited cell transistor to prevent FN tunneling from occurring between a floating gate and a channel. As a result, the program-inhibited cell transistor is maintained at an initial erased state.

In self-boosting techniques according to some embodiments of the present invention, a string select line SSL connected to a string select transistor is supplied with a voltage of 0 volts. A common source line CSL1 of a selected memory cell string 510 is supplied with a voltage of 0 volts, and a common source line CSL2 of an unselected memory cell string 520 is supplied with a power supply voltage Vcc as a program inhibition voltage. After a source of the ground select transistor is charged to Vcc-Vth (Vth being a threshold voltage of the ground select transistor) by applying a power supply voltage Vcc to the ground select line GSL, the ground select transistor is substantially blocked (or shut off). A selected word line is supplied with a program voltage Vpgm and unselected word lines are supplied with a pass voltage Vpass, boosting a channel voltage of a program-inhibited cell transistor to prevent FN tunneling from occurring between a floating gate and a channel. As a result, the program-inhibited cell transistor is maintained at an initial erase state. Hence a dummy transistor connected to a second memory cell string 520 is not programmed. Consequently, a threshold voltage of this dummy transistor retains a negative value.

Figure 9:
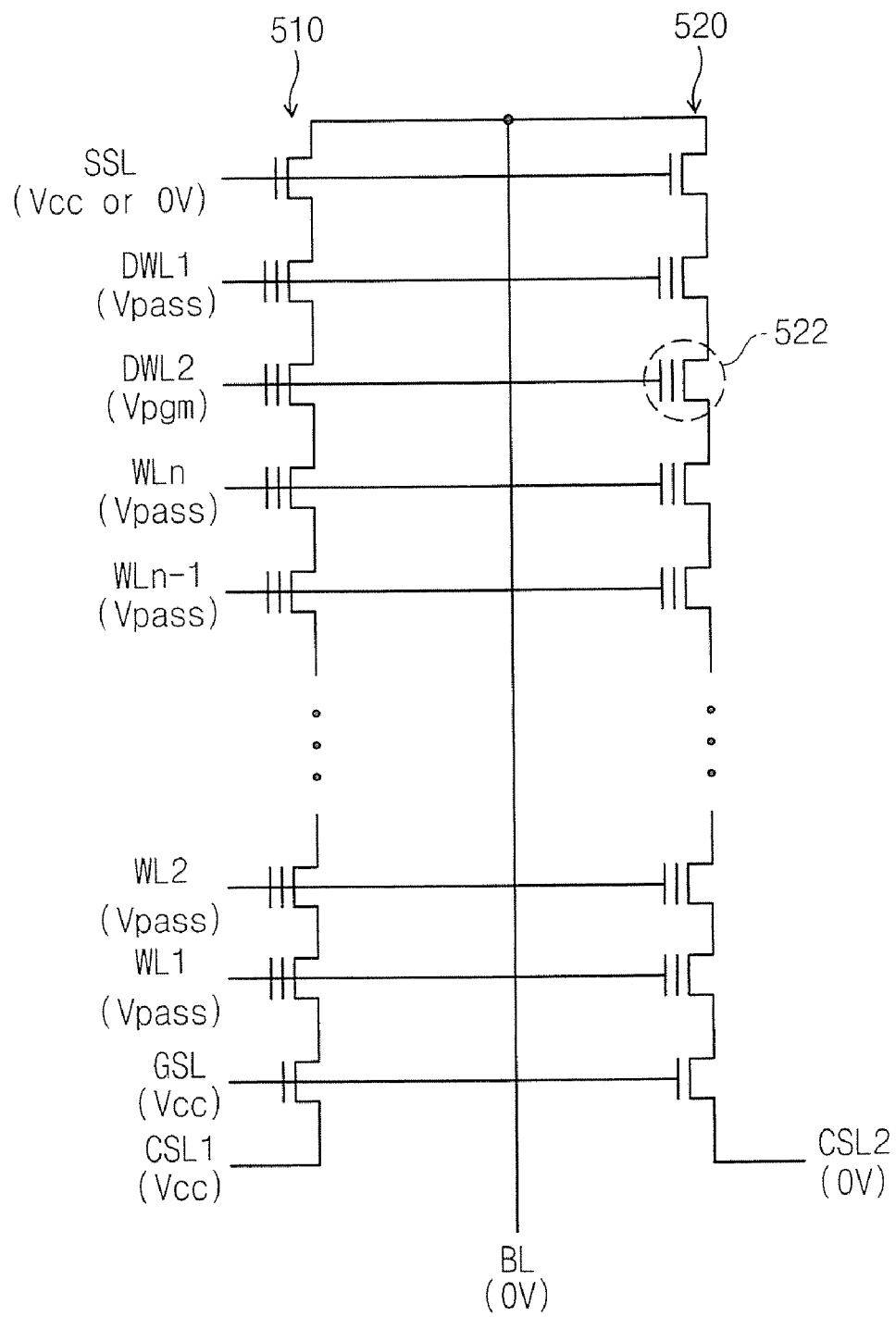
FIG. 9 is a circuit diagram illustrating bias conditions for programming a fourth dummy transistor of a flash memory device according to some embodiments of the present invention.

FIG. 9 is a circuit diagram illustrating bias conditions for programming a dummy transistor 522 of the second string 520 The string select line SSL is supplied with a power supply voltage Vcc or a voltage of 0 volts. When the string select line SSL is supplied with the power supply voltage Vcc, leakage current to the bit line BL may be suppressed. The second dummy word line DWL2 is supplied with a program voltage Vpgm. The first dummy word line DWL1 and word lines WL1, WL2, . . . , WLn−1, WLn are supplied with a pass voltage Vpass. The ground select line GSL is supplied with a power supply voltage Vcc. The second common source line CSL2 and a bit line are supplied with a voltage of 0 volt. This programs the dummy transistor 522 to have a positive threshold voltage. Because the first common source line CSL1 is supplied with a power supply voltage Vcc, transistors of the first memory cell string 510 are not programmed.

Figure 10:
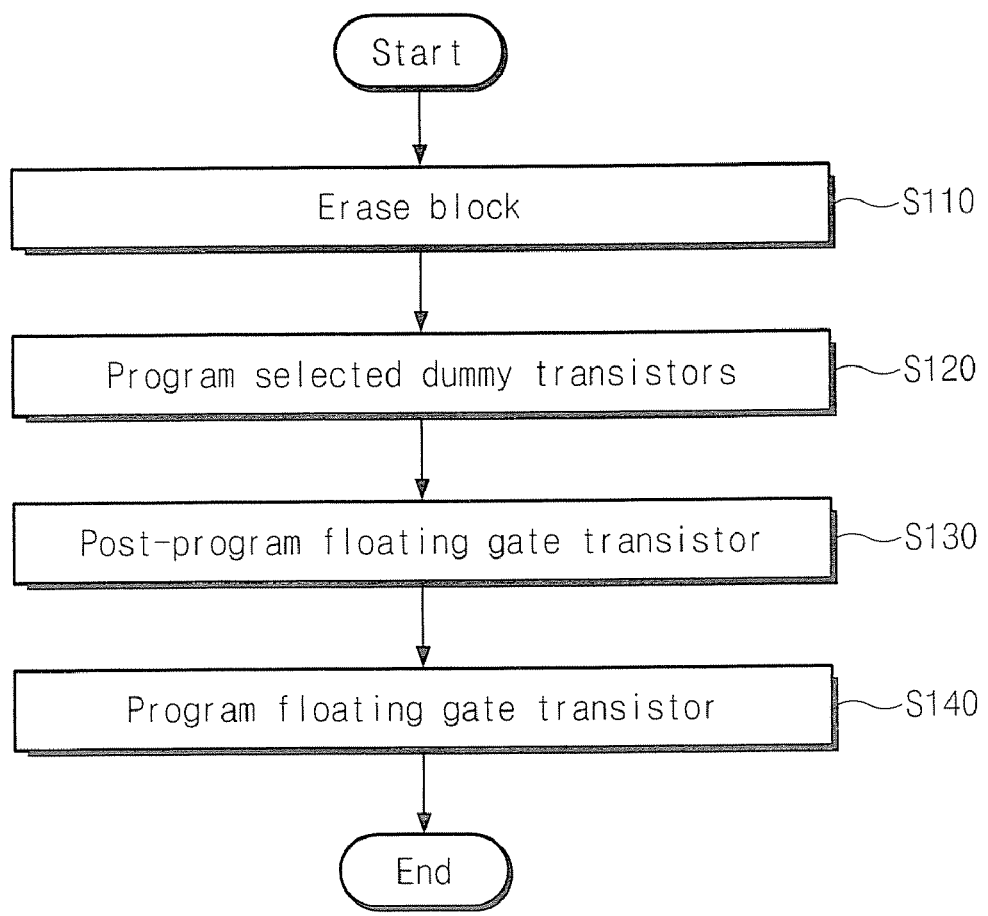
FIG. 10 is a flowchart illustrating program timing of a dummy transistor of a flash memory device according to some embodiments of the present invention.

FIG. 10 is a flowchart illustrating operations for programming a flash memory device having a structure along the lines described above with reference to FIGS. 5 and 8 according to some embodiments of the present invention. Transistors in a selected memory block are erased (block S110). Due to the erase operation, a threshold voltage of dummy transistors and floating transistors may become negative. Selected dummy transistors, dummy transistors 512 and 522, are programmed (block S120), such that their threshold voltages are increased. The memory cell floating gate transistors are post-programmed to compensate for over-erasure arising from the erase operation (block S130). In certain embodiments, the post-program operation may be omitted. The memory cell floating gate transistors are selectively programmed to store particular data values (block S140).

Figure 11:
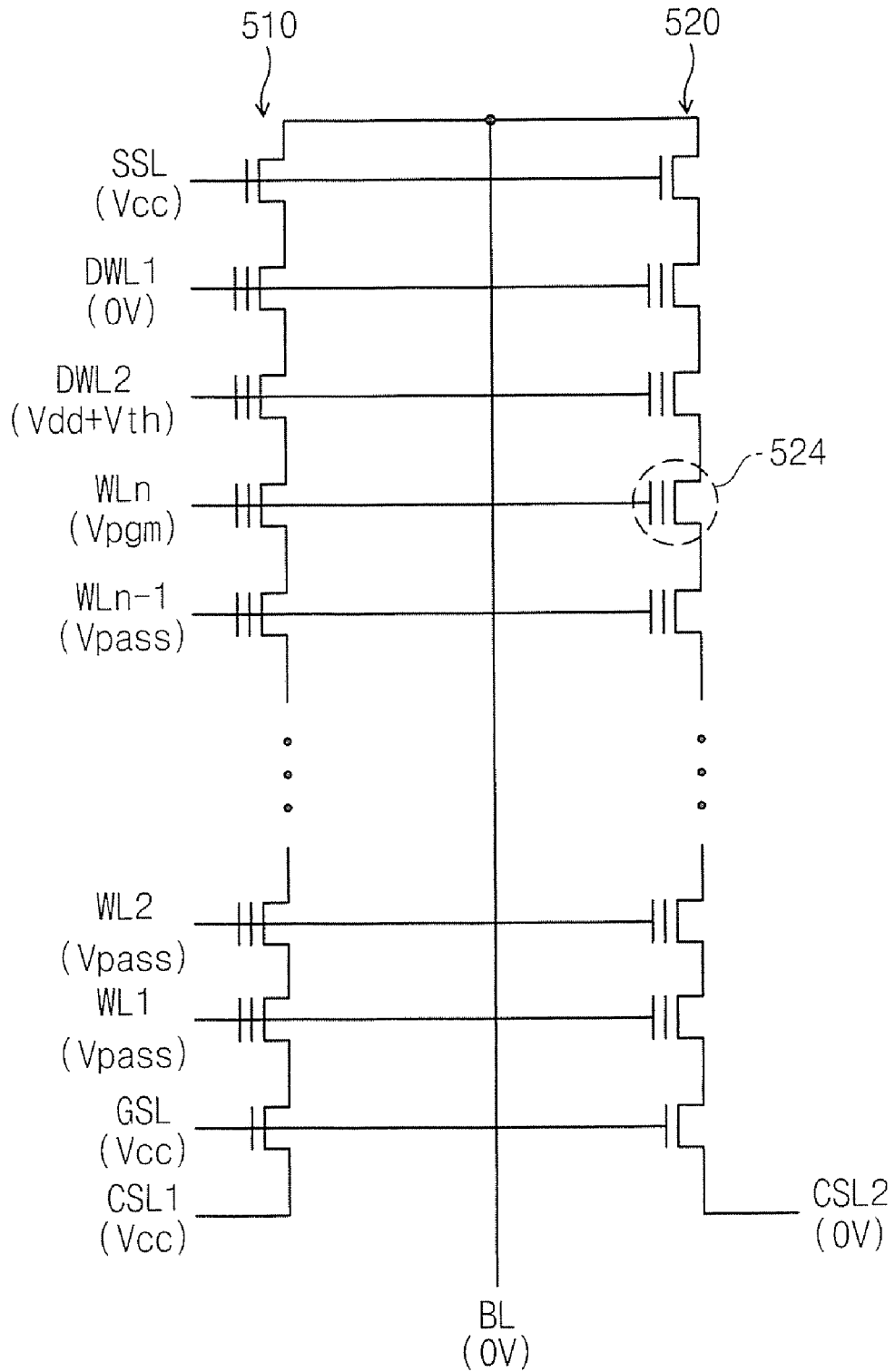
FIG. 11 is a circuit diagram illustrating bias conditions for programming a floating gate transistor of a flash memory according to some embodiments of the present invention.

FIG. 11 is a circuit diagram illustrating bias conditions for programming a flash memory having the structure illustrated in FIG. 5 according to some embodiments of the present invention. Programming a floating gate transistor 524 of the second string 520 connected to an $n^{th}$ word line WLn will now be described with reference to FIG. 11. The string select line SSL is supplied with a power supply voltage Vcc or a voltage of 0 volts. When the string select line SSL is supplied with the power supply voltage Vcc, leakage current to a bit line BL may be suppressed. The first dummy word line DWL1 is supplied with a voltage of 0 volts, and the second dummy word line DWL2 is supplied with a voltage Vdd+Vth. Thus, the dummy transistor of the first string 510 connected to the first dummy word line DWL1 is turned off and the dummy transistor of the second string connected to the first dummy word line DWL1 is turned on. The other word lines WL1, WL2, . . . , WL3 are supplied with a pass voltage Vpass. The ground select line GSL is supplied with a power supply voltage Vcc. The first common source line CSL1 is supplied with a power supply voltage Vcc, and the second common source line CSL2 and the bit line BL are supplied with a voltage of 0 volts. The floating gate transistor 824 is programmed under these conditions, while the first memory cell string is disconnected from the bit line BL such that floating gate transistors thereof are not programmed.

However, if a floating gate transistor in the first memory cell string 510 was already programmed, a program inhibition voltage Vcc from the first common source line CSL may not be transferred to the channel of the first string 510. As a result, the channel may be insufficiently boosted to prevent program disturbance. According to some embodiments, a channel voltage of the first memory cell string 510 is boosted before the second memory cell string 520 is programmed.

Figure 12:
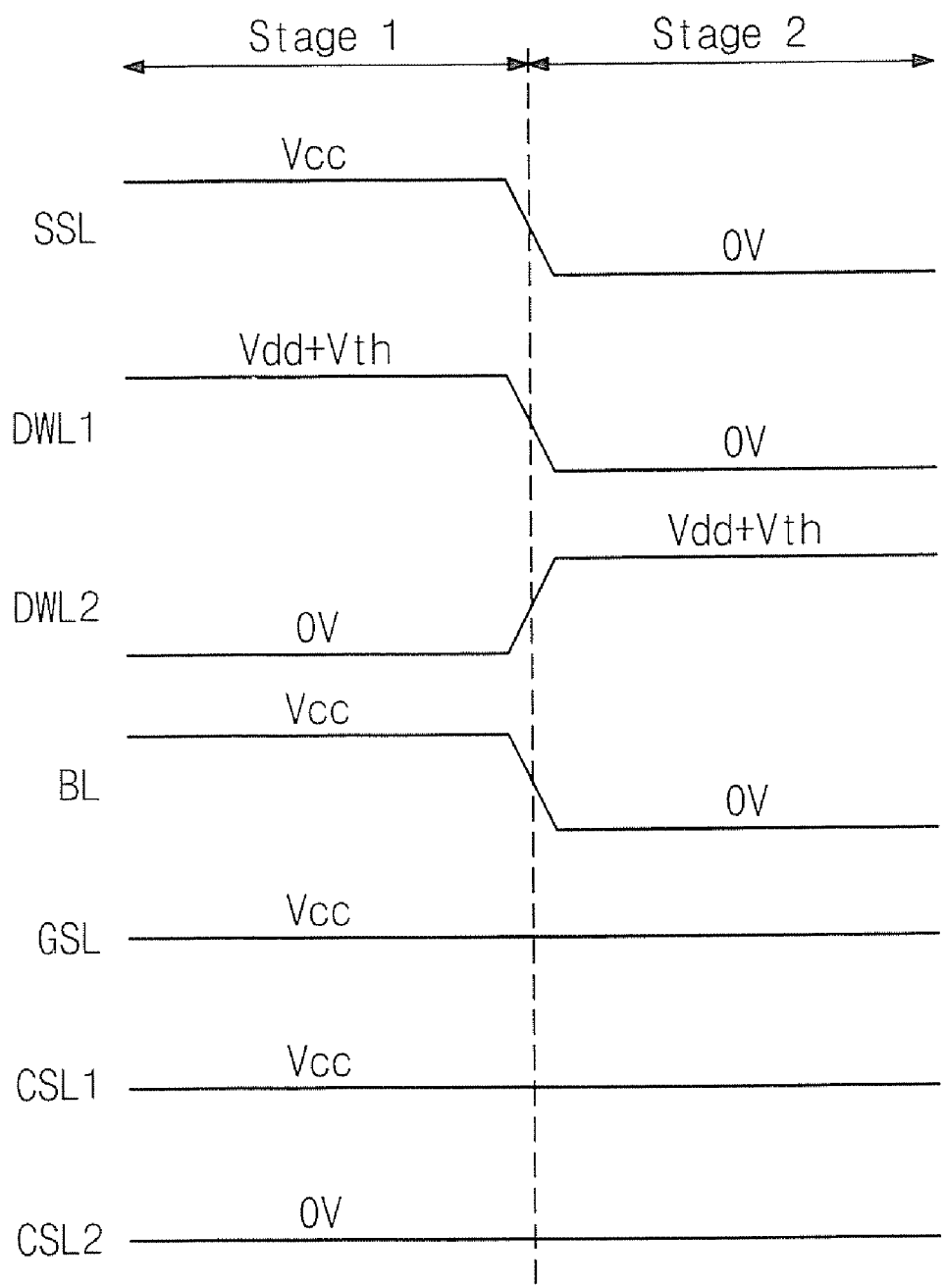
FIG. 12 is a timing diagram illustrating program bias conditions for preventing program disturbance according to some embodiments of the present invention.

FIG. 12 illustrates such a two-stage process in which the channel voltage of the first memory cell string 510 is boosted before a floating gate transistor of the second cell string 520 is programmed. The string select line SSL is supplied with a power supply voltage Vcc to turn on the string select transistors. The first dummy word line DWL1 is supplied with a voltage Vdd+Vth to turn on the dummy transistors connected thereto. The second dummy word line DWL2 is supplied with a voltage of 0 volts to turn on the dummy transistor in the first string 510 connected thereto and to turn off the dummy transistor in the second string 520 connected thereto. As a result, the first memory cell string 510 is connected to the bit line BL. The bit line BL is supplied with a power supply voltage Vcc. The ground select line GSL is supplied with a power supply voltage Vcc. The first common source line is supplied with a power supply voltage Vcc. Due to these bias conditions, the channel voltage of the first memory cell string 510 is raised.

Following this boosting, the string select line SSL is supplied with a voltage of 0 volt to turn off the string select transistors. The first dummy word line DWL1 is supplied with a voltage of 0 volts to turn off the dummy transistor of the first string 510 connected thereto, and to turn on the dummy transistor of the second string 520 connected thereto. The second dummy word line DWL2 is supplied with Vdd+Vth to turn on the dummy transistors connected thereto. The ground select line GSL is supplied with a power supply voltage Vcc. The first common source line CSL1 is supplied with a power supply voltage Vcc, and the second common source line CSL2 is supplied with a voltage of 0 volts. Under these bias conditions, the floating gate transistor 524 is programmed while floating gate transistors of the first memory cell string 510 are not programmed.

However, the present invention is not limited to the foregoing and, if necessary, the bias conditions may be changed. A technical feature of this embodiment is to program a floating gate transistor in a selected memory cell string after raising a channel voltage of an unselected memory cell string. In order to achieve the technical feature, the bias conditions may be varied.

Figure 13:
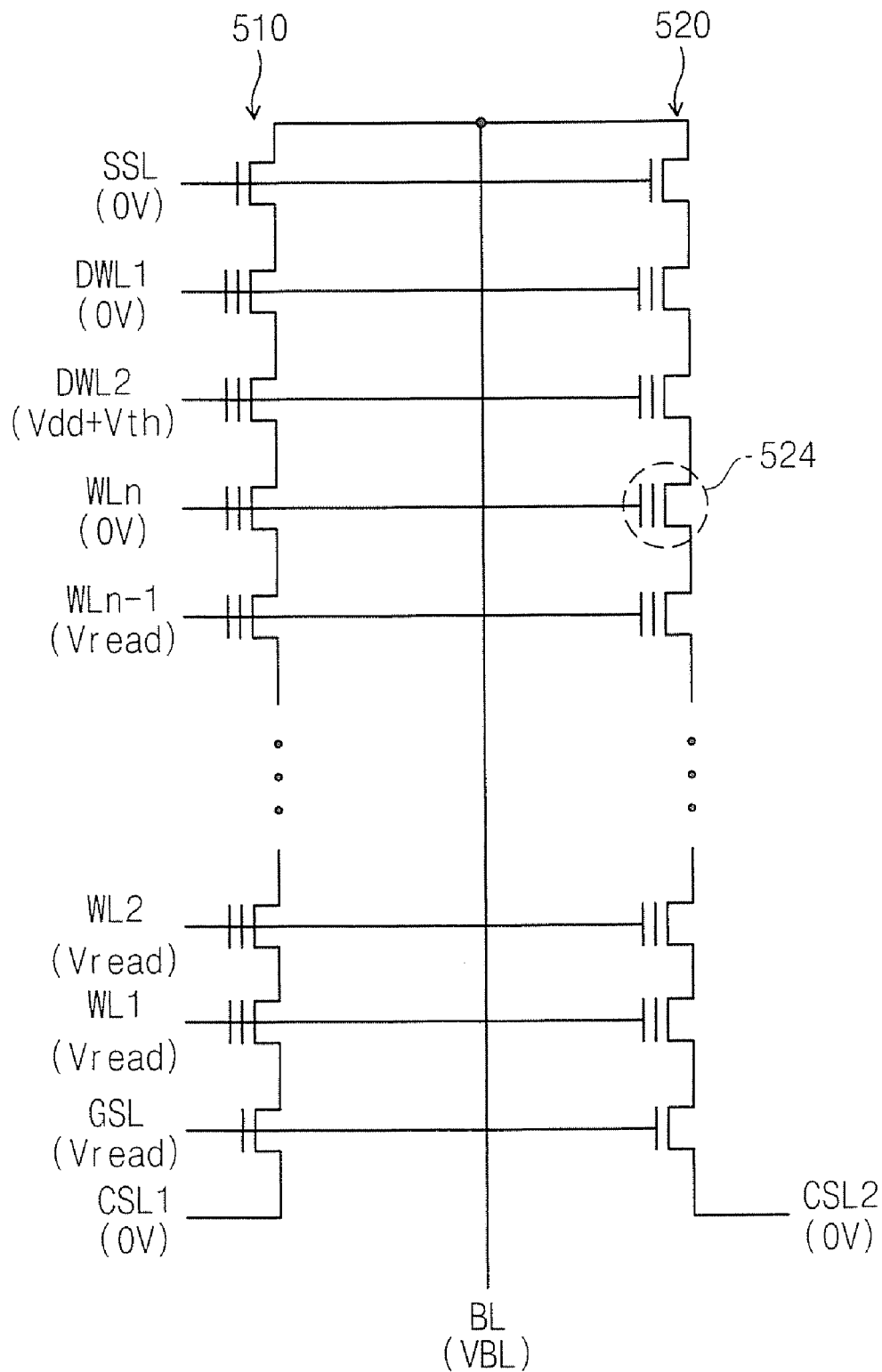
FIG. 13 is a circuit diagram illustrating bias conditions for reading a floating gate transistor of a flash memory according to some embodiments of the present invention.

FIG. 13 illustrates bias conditions for reading the floating gate transistor 524 shown in FIG. 11 according to some embodiments of the present invention. The string select line SSL is supplied with a voltage of 0 volts. The first dummy word line DWL1 is supplied with a voltage of 0 volts, and the second dummy word line DWL2 is supplied with a voltage Vdd+Vth. Thus, the second memory cell string 520 is connected to the bit line BL. The $n^{th}$ word line WLn is supplied with a voltage of 0 volts. The other word lines WL1, WL2, .. ., WLn−1 and the ground select line GSL are supplied with a read voltage Vread. The first common source line CSL1 is supplied with a voltage of 0 volts. Alternatively, the first common source line CSL1 may be supplied with a higher voltage (e.g., 1.5 volts) to prevent read disturbance. In particular, the first common source line CSL1 may be driven with the higher voltage than 0 volts, raising a channel voltage of a first memory cell string 510 to prevent soft programming caused by the read voltage Vread. The second common source line CSL2 is supplied with a voltage of 0 volts. The bit line BL is supplied with a precharge voltage VBL. Thus, the data stored in the floating gate transistor 524 may be read. Because the first memory cell string 510 is not connected to the bit line BL, data stored in the floating gate transistor connected to the $n^{th}$ word line is not read.

Figure 14:
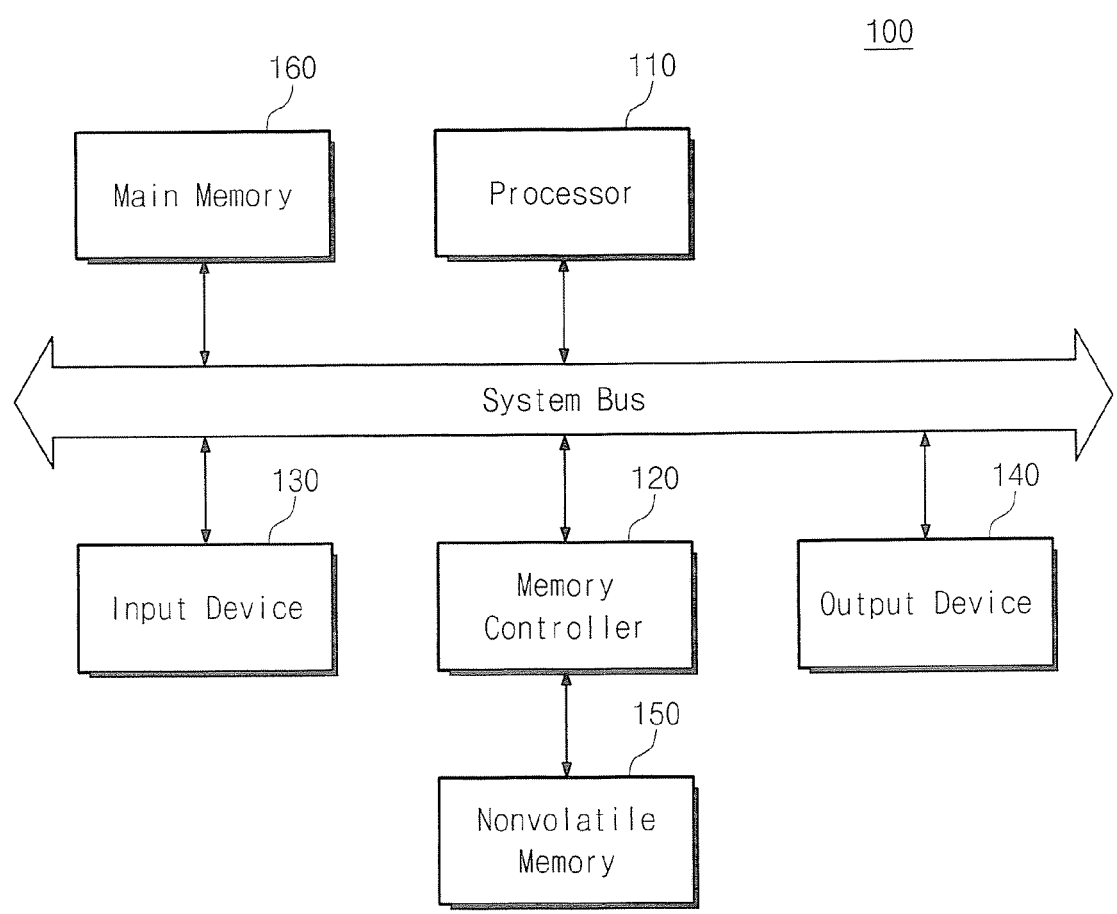
FIG. 14 is a block diagram of a computing system including a flash memory according to some embodiments of the present invention.

FIG. 14 is a block diagram of a computing system 100 including a flash memory that may take the form and provide operations according to some embodiments of the present invention along the lines discussed above. As shown in FIG. 14, the computing system 100 includes a processor 110, a memory controller 120, input devices 130, output devices 140, a flash memory 150, and a main memory device 160. A solid line represents a system bus through which data or instruction is transmitted.

The memory controller 120 and the flash memory 150 may be included in, for example, a memory card. The processor 110, the input devices 130, the output devices 140, and the main memory device 160 may be parts of a host using the memory card. The computing system 100 receives data through the input devices (e.g., keyboard, camera, etc.). The received data may be, for example, a user instruction or multimedia data, such as video data generated by a camera or the like. The received data may be stored in the flash memory 150 or the main memory device 160.

A processing result obtained by the processor 110 may be stored in the flash memory 150 or the main memory device 160. The output devices 140 may output the data stored in the flash memory 150 or the main memory device 160. The output devices 140 may output, for example, human-sensible data. For example, the output device 140 may include a display or a speaker. A bit line share structure according to some embodiments of the present invention may be applied to the flash memory 150. As integration density and reliability of the flash memory 150 are enhanced, those of the computing system 100 may also be enhanced.

The flash memory 150 and/or the memory controller 120 may be mounted using various types of packages such as, for example, a package on package (PoP), Ball grid arrays (BGAs), Chip Scale Packages (CSPs), Die in Waffle Pack, Die in Wafer Form. Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-level Processed Stack Package (WSP). Although not shown in the figure, a power supply may supply power for operation of the computing system 100. In the case that the computing system 100 is a mobile device, the power supply may include a battery.

Figure 15:
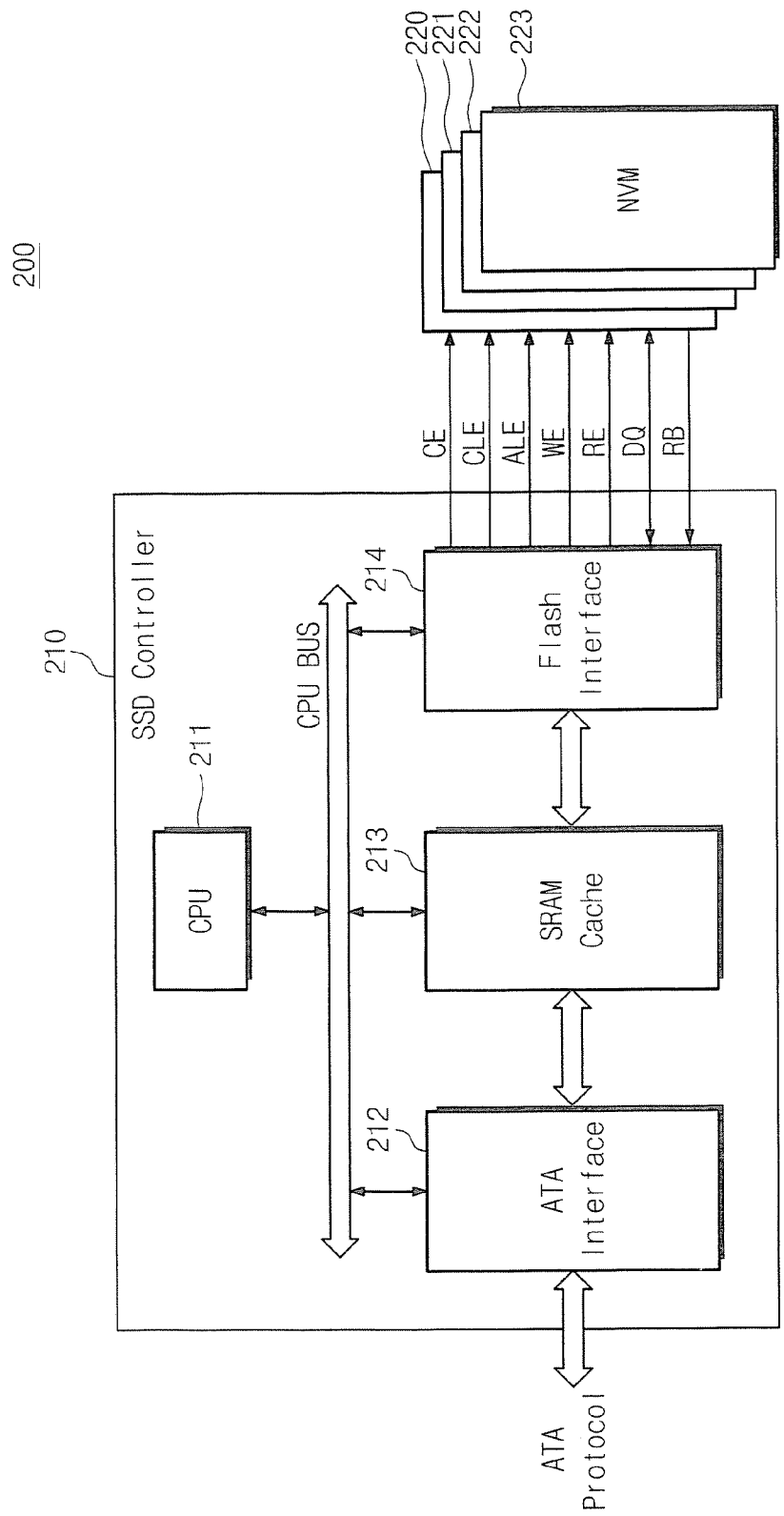
FIG. 15 is a block diagram of an SSD system according to some embodiments of the present invention.

FIG. 15 is a block diagram of a solid state drive (SSD) system 200 according to some embodiments of the present invention. As shown in FIG. 15, the SSD system 200 includes an SSD controller 210 and flash memories 220-223, which may operate along the lines discussed above. It is expected that SSD devices will be substituted for hard disk drive (HDD) devices. In recent years, SSD devices are increasingly attractive in the next-generation memory market. SSD is a data storage device using memory chips such as a flash memory instated of a platter for use in a typical hard disk drive. Advantageously, SSD may offer higher speed, greater shock resistance and/or lower power dissipation than HDD systems.

A central processing unit (CPU) receives an instruction from a host, deciding whether to store data from the host in a flash memory or to transmit data stored in the flash memory after reading the stored data. An ATA interface 212 exchanges data with a host side in compliance with the control of the CPU. The ATA interface 212 includes a serial ATA (SATA) protocol and a parallel ATA (PATA) protocol. The ATA interface 212 fetches instruction and address from the host side and transmits the fetched instruction and address to the CPU 211 through a CPU bus. Data input from the host through the ATA interface or data to be transmitted to the host is transmitted to an SRAM cache 213 in compliance with the control of the CPU 211 without passing through the CPU bus.

The SRAM cache 213 is configured to temporarily store data transmitted between the host and the flash memories 220-223 and to store a program executed by the CPU 211. The SRAM cache 213 may be regarded as a kind of a buffer memory and does not necessarily include an SRAM. A flash interface 214 receives/transmits data from/to nonvolatile memories used as storage devices. The flash interface 214 may be configured to support a NAND flash memory, a OneNAND flash memory or a multi-level flash memory. A semiconductor memory system according to some embodiments of the present invention may be used as a mobile storage device. Therefore, the semiconductor memory system may be used as a storage device for MP players, digital cameras, personal digital assistants (PDA), and e-books. Moreover, the semiconductor memory system may be used as a storage device for digital television sets or computers.

As explained so far, a flash memory device according to some embodiments of the present invention uses a dummy transistor to select a memory cell string of a common bit line structure. Thus, there is no need for an area where a string select transistor is disposed. According to some embodiments of the present invention, integration density of a flash memory device is improved and fabrication cost thereof is reduced.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A flash memory device comprising
a first memory cell string comprising a plurality of serially-connected memory cells and first and second serially-connected dummy transistors configured to couple the serially-connected memory cells to a bit line; and
a second memory cell string comprising a plurality of serially-connected memory cells and first and second serially-connected dummy transistors configured to couple the serially-connected memory cells to the bit line,
wherein the first dummy memory cells of the first and second memory cell strings have gates connected in common to a first dummy word line and have different threshold voltages and wherein the second dummy memory cells of the first and second memory cell strings have gates connected in common to a second dummy bit line and have different threshold voltages; and
wherein the first dummy memory cell of the first memory cell string and the second dummy memory cell of the second memory cell string have threshold voltages greater than a predetermined voltage and wherein the second dummy memory cell of the first memory cell string and the first dummy memory cell of the second memory cell string have threshold voltages less than the predetermined voltage.

2. The flash memory cell device of claim 1, wherein the first dummy memory cell of the first memory cell string and the second dummy memory cell of the second memory cell string have positive threshold voltages and wherein the second dummy memory cell of the first memory cell string and the first dummy memory cell of the second memory cell string have negative threshold voltages.

3. The flash memory device of claim 1, further comprising a control circuit configured to control the threshold voltages of the dummy memory cells.

4. The flash memory device of claim 3, wherein the control circuit is configured to erase the first and second dummy memory cells of the first and second memory cell strings and to thereafter selectively program the first and second dummy memory cells of the first and second memory cell strings.

5. The flash memory device of claim 1, wherein the first memory cell string further comprises a first ground select transistor configured to connect the serially-connected memory cells of the first memory cell string to a first common source line and wherein the second memory cell string further includes a second ground select transistor configured to connect the serially-connected memory cells of the second memory cell string to a second common source line.

6. The flash memory device of claim 5, further comprising a control circuit configured to apply a program voltage, a pass voltage and a ground voltage to the first dummy word line, the second dummy word line, and the first common source line with, respectively, to program the first dummy transistor of the first memory cell string.

7. The flash memory device of claim 5, further comprising a control circuit configured to apply a pass voltage, a program voltage and a ground voltage to the first dummy word line, the second dummy word line and the second common source line, respectively, to program the second dummy transistor of the second memory cell string.

8. The flash memory device of claim 5, wherein the serially-connected memory cells of the first memory cell string are floating gate transistors and wherein the flash memory device further comprises a control circuit configured to apply a voltage higher than the threshold voltage of the first dummy transistor of the first memory cell string, a ground voltage and a ground voltage to the first dummy word line, the second dummy word line and the second common source line, respectively, to program a selected one of the floating gate transistors of the first memory cell string.

9. The flash memory device of claim 8, wherein the control circuit is further configured to increase a channel voltage of the second memory cell string before programming the selected one of the floating gate transistors of the first memory cell string.

10. The flash memory device of claim 5, wherein the serially-connected memory cells of the second memory cell string are floating gate transistors and wherein the flash memory device further comprises a control circuit configured to apply a ground voltage, a voltage higher than the threshold voltage of the second dummy transistor of the second memory cell string and a ground voltage supply to the first dummy word line, the second dummy word line and the first common source line, respectively, to program a selected one of the floating gate transistors of the second memory cell string.

11. The flash memory device of claim 10, wherein the control circuit is configured to increase a channel voltage of the first memory cell string before programming the selected one of the floating gate transistors of the second memory cell string.

12. The flash memory device of claim 5, wherein the first memory cell string further comprises third and fourth serially-connected dummy memory cells configured to connect the serially-connected memory cells of the first memory cell string to the first ground select transistor and wherein the second memory cell string further comprises third and fourth serially-connected dummy memory cells configured to connect the serially-connected memory cells of the second memory cell string to the second ground select transistor.

13. The flash memory device of claim 12, wherein the third dummy memory cells of the first and second memory cell strings are connected to a third dummy word line and have different threshold voltages and wherein the fourth dummy memory cells of the first and second memory cell strings are connected to a further dummy word line and have different threshold voltages.

14. The flash memory device of claim 13, wherein the third dummy memory cell of the first memory cell string and the fourth dummy memory cell of the second memory cell string have threshold voltages greater than a predetermined voltage and wherein the fourth dummy memory cell of the first memory cell string and the third dummy memory cell of the second memory cell string have threshold voltages less than the predetermined voltage.

15. The flash memory cell device of claim 13, wherein the third dummy memory cell of the first memory cell string and the fourth dummy memory cell of the second memory cell string have positive threshold voltages and wherein the fourth dummy memory cell of the first memory cell string and the third dummy memory cell of the second memory cell string have negative threshold voltages.

* * * * *